(12) United States Patent
Kim

(10) Patent No.: US 11,038,053 B2
(45) Date of Patent: Jun. 15, 2021

(54) SEMICONDUCTOR DEVICE AND METHOD OF MANUFACTURING THE SAME

(71) Applicant: SAMSUNG ELECTRONICS CO., LTD., Suwon-si (KR)

(72) Inventor: Jong Su Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 288 days.

(21) Appl. No.: 16/531,793

(22) Filed: Aug. 5, 2019

(65) Prior Publication Data
US 2019/0355848 A1    Nov. 21, 2019

Related U.S. Application Data

(63) Continuation of application No. 15/843,765, filed on Dec. 15, 2017, now Pat. No. 10,403,751.

(60) Provisional application No. 62/445,960, filed on Jan. 13, 2017.

(51) Int. Cl.
| | | |
|---|---|---|
| *H01L 29/78* | (2006.01) | |
| *H01L 21/768* | (2006.01) | |
| *H01L 29/08* | (2006.01) | |
| *H01L 29/10* | (2006.01) | |
| *H01L 23/535* | (2006.01) | |
| *H01L 29/45* | (2006.01) | |
| *H01L 29/66* | (2006.01) | |
| *H01L 27/092* | (2006.01) | |
| *H01L 21/311* | (2006.01) | |
| *H01L 21/027* | (2006.01) | |
| *H01L 21/3105* | (2006.01) | |
| *H01L 21/8238* | (2006.01) | |

(52) U.S. Cl.
CPC .... *H01L 29/7827* (2013.01); *H01L 21/76895* (2013.01); *H01L 23/535* (2013.01); *H01L 29/0847* (2013.01); *H01L 29/1037* (2013.01); *H01L 29/45* (2013.01); *H01L 29/6656* (2013.01); *H01L 29/66666* (2013.01); *H01L 21/0276* (2013.01); *H01L 21/31053* (2013.01); *H01L 21/31116* (2013.01); *H01L 21/823885* (2013.01); *H01L 27/092* (2013.01); *H01L 29/6653* (2013.01)

(58) Field of Classification Search
CPC ............... H01L 21/76816; H01L 21/31144
See application file for complete search history.

(56) References Cited

U.S. PATENT DOCUMENTS

| | | | |
|---|---|---|---|
| 9,799,655 B1 * | 10/2017 | Cheng | ................ H01L 27/0924 |
| 2018/0204946 A1 | 7/2018 | Kim | |
| 2018/0248034 A1 | 8/2018 | Leobandung | |

* cited by examiner

*Primary Examiner* — Elias Ullah
(74) *Attorney, Agent, or Firm* — F. Chau & Associates, LLC

(57) ABSTRACT

A semiconductor device includes a substrate, and a first source/drain region formed on the substrate. The semiconductor device further includes a channel formed on the first source/drain region, and a second source/drain region formed on the channel. The semiconductor device also includes a gate electrode formed on an external surface of the channel, and a metal pad formed on the substrate. The height of an upper surface of the metal pad is the same as the length of an upper surface of the gate electrode.

16 Claims, 11 Drawing Sheets

SEMICONDUCTOR DEVICE AND METHOD OF MANUFACTURING THE SAME

CROSS-REFERENCE TO RELATED APPLICATIONS

This application is a continuation of U.S. patent application Ser. No. 15/843,765 filed on Dec. 15, 2017, which claims the benefit of U.S. Provisional Application No. 62/445,960, filed on Jan. 13, 2017.

TECHNICAL FIELD

This invention relates generally to a semiconductor device with metal contacts and a method of manufacturing the semiconductor device having metal contacts.

DISCUSSION OF RELATED ART

In the manufacture of a semiconductor device, a plurality of metal contacts may be used to electrically connect the gate, drain, source contacts of a field effect transistor (FET) to another circuit. For example, in a vertical channel FET, the plurality of metal contacts may include columnar structure and disposed in a direction perpendicular to a surface of a substrate of the semiconductor device. The dimension of the metal contacts may vary from each other. For forming the plurality of metal contacts having different dimensions, multiple etching processes may be necessary.

SUMMARY

According to an exemplary embodiment of the present inventive concept, a semiconductor device includes a substrate, and a first source/drain region formed on the substrate. The semiconductor device further includes a channel formed on the first source/drain region, and a second source/drain region formed on the channel. The semiconductor device still further includes a gate electrode formed on an external surface of the channel, and a metal pad formed on the substrate. The height of an upper surface of the metal pad is the same as the height of an upper surface of the gate electrode.

According to an exemplary embodiment of the present inventive concept, a method for manufacturing a semiconductor device includes forming a first source/drain region in a substrate, and forming a channel on the first source/drain region. The method further includes forming a second source/drain region on the channel. The method still further includes forming a gate electrode on an outer surface of the channel, and forming a metal pad on the substrate. Forming the gate electrode and forming the metal pad occur simultaneously.

According to an exemplar embodiment of the present inventive concept, a semiconductor device includes a first field effect transistor (FET). The first FET includes a first bottom source/drain region formed on a substrate, a first channel including an external surface, and formed on the bottom source/drain region, a first upper source/drain region formed on the first channel, and a first metal pad formed on the substrate. The semiconductor device includes a second field effect transistor (FET). The second FET includes a second bottom source/drain region formed on the substrate, a second channel including an external surface, and formed on the bottom source/drain region, a second upper source/drain region formed on the first channel, and a second metal pad formed on the substrate. The semiconductor device further includes a gate electrode formed on the external surfaces of the first and second channels. The height of the first metal pad and the second metal pad is the same as the height of the gate electrode.

According to an exemplary embodiment of the present inventive concept, a method for manufacturing a semiconductor device includes forming a first space layer, a silicide layer, and a stack comprising a first insulating layer and a vertical channel on a substrate. The method further includes forming a gate metal layer on the first space layer, the silicide layer, and the stack, and forming a second spacer layer over the gate metal layer and the stack. The method still further includes forming an organic planarization layer (OPL) over the second spacer layer, and removing a portion of the OPL, the second spacer layer, and the gate metal layer to expose a portion of the first spacer layer. The method still includes removing remaining portion of the OPL, and forming a third spacer layer over the second spacer layer, the gate metal layer, and the stack. The method still includes forming a second insulating layer over the second spacer layer, removing the first insulating layer of the stack, forming an upper source/drain region on the vertical channel, and forming a fourth spacer layer on the second source/drain region. The method still further includes forming a third insulating layer on the second source/drain region, forming a first and second apertures on the silicide layer and the first spacer layer simultaneously, and forming a third aperture on the second source/drain region. The height of the gate metal layer on the silicide layer is the same as the height of the gate metal layer on the first spacer layer.

According to an exemplary embodiment of the present inventive concept, a method for constructing an integrated circuit includes forming a silicide layer, a first spacer layer, and a stack including a plurality of layers on a substrate, respectively. The stack is surrounded by the first spacer layer, and the silicide layer and the first spacer layer are positioned right next to each other. The method further includes forming a metal layer on the first spacer layer and the silicide layer. The method further includes forming a photoresist layer on the metal layer, and patterning the photoresist layer. The method still further includes removing a first portion of the metal layer formed on a first portion of the first spacer layer that is positioned between the silicide layer and the stack. The method further includes forming a second portion of the metal layer on the silicide layer and a third portion of the metal layer on a second portion of the first spacer layer. The thickness of the second portion is the same as the thickness of the third portion. The method still includes manufacturing the integrated circuit including the second and third portions of the metal layers.

BRIEF DESCRIPTION OF THE DRAWINGS

The above and other features of the present inventive concept will be more apparent by describing in detail exemplary embodiments thereof, with reference to the accompanying drawings, which.

DETAILED DESCRIPTION OF EMBODIMENTS

Exemplary embodiments of the present inventive concept will be described more fully hereafter with reference to the accompanying drawing. The present disclosure may, however, be embodied in many different forms and should not be construed as limited to the embodiments set forth herein.

It will be understood that when an element such as a layer, film, region, or substrate is referred to as being "on" another element, it can be directly on the other element or intervening elements may also be present. It will be also understood that when an element such as a layer, film, region, or substrate is referred to as being "under" another element, it can be directly under the other element or intervening elements may also be present.

Figure 1:
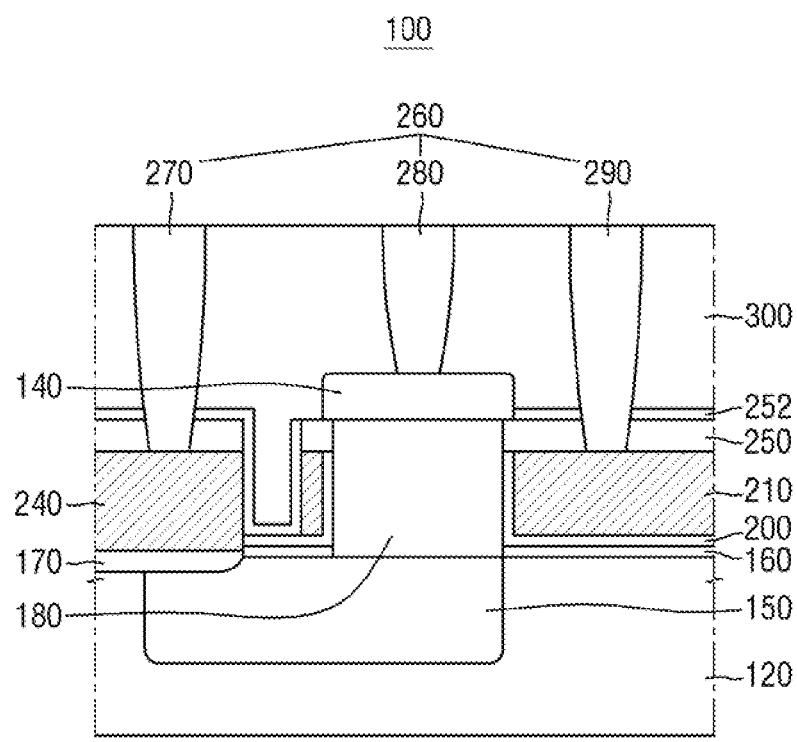
FIG. 1 is a cross-sectional view of a semiconductor device according to an exemplary embodiment of the present inventive concept.

Referring to FIG. 1, a cross-sectional view of a semiconductor device 100 is illustrated according to an exemplary embodiment of the present inventive concept. The semiconductor device 100 may include a vertical channel field effect transistor (FET). In one example, the semiconductor device 100 may include a n-type FET. In another example, the semiconductor device 100 may include a p-type FET.

The semiconductor device 100 may include a substrate 120. The substrate 120 may be a bulk silicon (Si), or silicon-germanium (SiGe) substrate. The semiconductor device 100 may include a top source/drain region 140, and a bottom source/drain region 150. The top and bottom source/drain regions 140, 150 may be doped with n-type impurity or p-type impurity to form an n-doped semiconductor layer or p-doped semiconductor layer. The bottom source/drain region 150 may include, for example, Si or SiGe, and the top source/drain region 140 may include, for example, Si or SiGe. A bottom spacer 160 may be formed on the bottom source/drain region 150. In one example, the bottom spacer 160 may include titanium nitride (TiN), and may be formed to cover at least a portion of the bottom source/drain region 150 when viewed from a direction perpendicular to a surface of the substrate 120.

A silicide layer 170 may be formed on the substrate 120 for providing a reduced electrical resistance contact. The silicide layer 170 may include, for example, titanium silicide ($TiSi_2$). In one example, the silicide layer 170 with reduced resistance may be formed so that the silicide layer 170 may be electrically coupled to the bottom source/drain region 150 by overlapping a portion of the silicide layer 170 with a portion of the bottom source/drain region 150, and may apply electrical signal to the bottom source/drain region 150. In one example, the height of an upper surface of the silicide layer 170 may be substantially same as or less than the height of an upper surface of the bottom spacer 160. In another example, the height of the upper surface of the silicide layer 170 may be greater than the height of the upper surface of the bottom spacer 160.

A vertical channel 180 may be formed between the top source/drain region 140 and the bottom source/drain region 150. As shown, the vertical channel 180 may be disposed at least on a portion of the bottom source/drain region 150. The vertical channel 180 may include, for example, an undoped semiconductor. For example, the vertical channel 180 may include Si, SiGe or III-V group materials.

A gate dielectric layer 200 with predetermined thickness may be formed on the outer surface of the vertical channel 180. In one example, the gate dielectric layer 200 may be formed to cover substantially the entire outer surface of the vertical channel 180. In another example, the gate dielectric layer 200 may be formed on the bottom spacer 160. The gate dielectric layer 200 may include, for example, silicon oxide (SiO), silicon nitride (SiN), silicon oxynitride (SiON), zirconium oxide (ZrO), zirconium oxynitride (ZrON), hafnium zirconium oxide, aluminum oxide ($Al_2O_3$), tantalum pentoxide ($Ta_2O_5$), or compounds thereof. In another example, the gate dielectric layer 200 may include high K dielectric materials, for example, barium titanate, barium strontium titanate oxide, titanium oxide, or compounds thereof.

A gate electrode 210 may be formed on the gate dielectric layer 200. As shown in FIG. 1, the height of an upper surface of the gate electrode 210 may be substantially the same as the height of an upper surface of the vertical channel 180. The gate electrode 210 may include, for example, tungsten (W), cobalt (Co), copper (Cu), tantalum (Ta), titanium (Ti), ruthenium (Ru), aluminum (Al), metal carbides, or metal nitrides A metal pad 240 may be formed on the silicide layer 170 so that the metal pad 240 may be electrically coupled to the underlying silicide layer 170, which may be, in return, further electrically coupled to the bottom source/drain region 150. The metal pad may include, for example, tungsten (W), cobalt (Co), copper (Cu), tantalum (Ta), titanium (Ti), ruthenium (Ru), aluminum (Al), metal carbides, or metal nitrides. In one embodiment, the height of the metal pad may be substantially the same as the height of the gate electrode 210.

Spacers 250, 252 may be formed on the gate electrode 210. The spacer 250, 252 may include insulating material. In one example, the spacers 250, 252 may include silicon nitride (SiN) or the like, and may be formed using a low pressure chemical vapor deposition (LPCVD).

A plurality of metal contacts 260 may be provided for electrically coupling the bottom source/drain region 150, the top source/drain region 140, and the gate electrode 210 with one or more circuits outside the semiconductor device, respectively. Metal contact may include, for example, tungsten (W), cobalt (Co), copper (Cu), tantalum (Ta), titanium (Ti), ruthenium (Ru), aluminum (Al), metal carbides, or metal nitrides.

In one embodiment, the plurality of metal contacts 260 may include a first metal contact 270 electrically connected to the metal pad 240, a second metal contact 280 electrically connected to the top source/drain region 140, and a third metal contact 290 electrically connected to the gate electrode 210, respectively. In one example, a longitudinal length of the first metal contact 270 may be substantially the same as the longitudinal length of the third metal contact 290. In another embodiment, the height of the first metal contact 270 may be substantially the same as the height of the third metal contact 290.

An insulating oxide 300 may be formed on a portion of the bottom spacer 160, gate electrode 210, spacers 250, 252. The insulating oxide 300 may include, for example, silicon oxide (SiO), and may be formed using a chemical vapor deposition (CVD).

Figure 2:
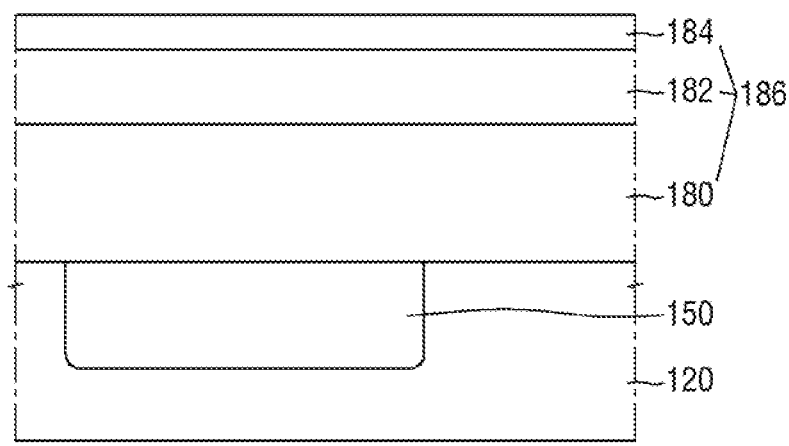
FIG. 2 is a cross-sectional view illustrating formation of a plurality of layers on the substrate during manufacture of a semiconductor device according to an exemplary embodiment of the present inventive concept

FIG. 2 is a cross-sectional view illustrating formation of a plurality of layers on the substrate 120 of the semiconductor device 100 according to an exemplary embodiment of the present inventive concept. In one example, the bottom source/drain region 150 may be formed on the substrate 120 by providing the n-type or p-type impurities to the substrate 120. The n-type or p-type impurities may be provided by, for example, ion implantation process, to form a bottom source/drain region (e.g., n-type or p-type doped region) 150 in the substrate 120. In one example, after the ion implantation process, the substrate 120 may be annealed at a predetermined temperature for controlling the impurity concentration with respect to the substrate depth.

A semiconductor layer 180 may be formed on the substrate 120. The semiconductor layer 180 may include, for example, silicon (Si). In other embodiments, semiconductor materials other than silicon may also be used as the semiconductor layer 180. The semiconductor layer 180 may be used as the channel in the semiconductor device as described above. An insulating layer 182 and an insulating layer 184 may be formed on the semiconductor layer 180 using, for example, the chemical vapor deposition (CVD). The insulating layers 182, 184 may include, for example, silicon nitride (SiN). The insulating layers 182, 184 may be used as hard masks in the subsequent steps.

After the semiconductor layer 180, the insulating layers 182, 184 are formed on the substrate 120, the semiconductor layer 180, the insulating layers 182, 184 may be etched to form a vertical structure 186. The vertical structure 186 may be formed by a photolithography process using a photoresist (not shown) as a mask.

Figure 3:
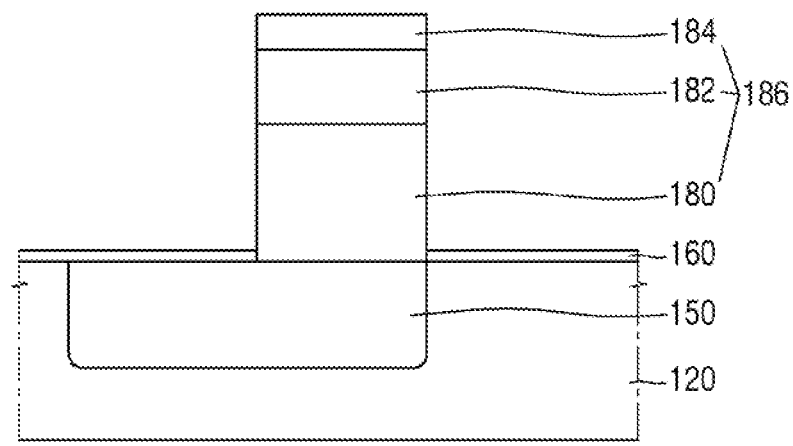
FIG. 3 is a cross-sectional view illustrating formation of a bottom spacer during manufacture of a semiconductor device according to an exemplary embodiment of the present inventive concept.

FIG. 3 is a cross-sectional view illustrating formation of the bottom spacer 160 of the semiconductor device 100 according to an exemplary embodiment of the present inventive concept. In one embodiment, the bottom spacer 160 may be formed on the substrate 120 using, for example, the chemical vapor deposition (CVD). In one example, the bottom spacer 160 may include titanium nitride (TiN). A portion of the bottom spacer 160 may be formed on an external surface of the vertical structure 186 and on an upper surface of the substrate 120. In one example, a reactive ion etching (RIE) process may be performed to substantially completely remove the bottom spacer 160 from the external surface of the vertical structure 186, while leaving substantially all of the bottom spacer 160 formed on the horizontal surface of the substrate 120.

Figure 4:
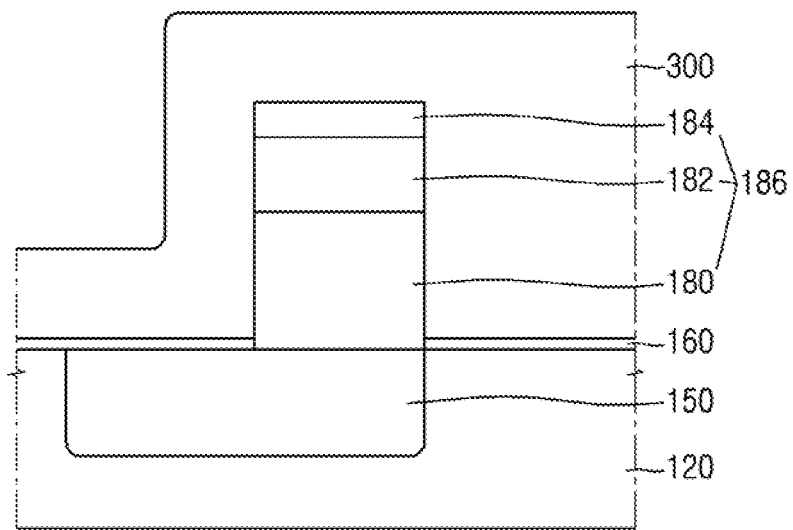
FIG. 4 is a cross-sectional view illustrating formation of an insulating oxide during manufacture of a semiconductor device according to an exemplary embodiment of the present inventive concept.

FIG. 4 is a cross-sectional view illustrating formation of the insulating oxide 300 during manufacture of the semiconductor device according to an exemplary embodiment of the present inventive concept. The insulating oxide 300 may be formed on the vertical structure 186 and on the bottom spacer 160 according to an exemplary embodiment of the present inventive concept. The insulating oxide 300 may include silicon oxide (NiO), and may be formed using the chemical vapor deposition (CVD).

Figure 5:
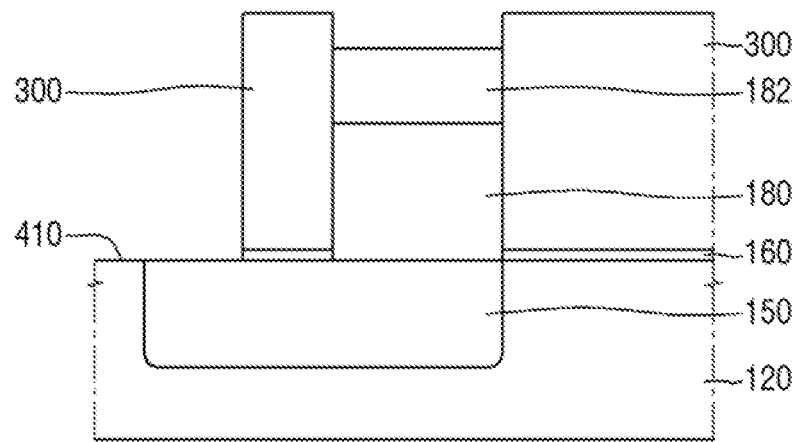
FIG. 5 is a cross-sectional view illustrating an etch back of the insulating oxide during manufacture of a semiconductor device according to an exemplary embodiment of the present inventive concept.

FIG. 5 is a cross-sectional view illustrating an etch back of the insulating oxide 300 during manufacturing of the semiconductor device 100 according to an exemplary embodiment of the present inventive concept. In one example, the insulating oxide 300 may be etched back until a portion of the bottom spacer 160 may be removed, and a portion 410 of the upper surface of the substrate 120 may be exposed. In another example, the etch back of the insulating oxide 300 may be performed until the insulating layer 184 is removed from the vertical structure 186, at which point the etch back of the insulating oxide 300 is determined to be complete. Either way, a portion of the bottom spacer 160 may not be present from the portion 410 of the substrate 120.

Figure 6:
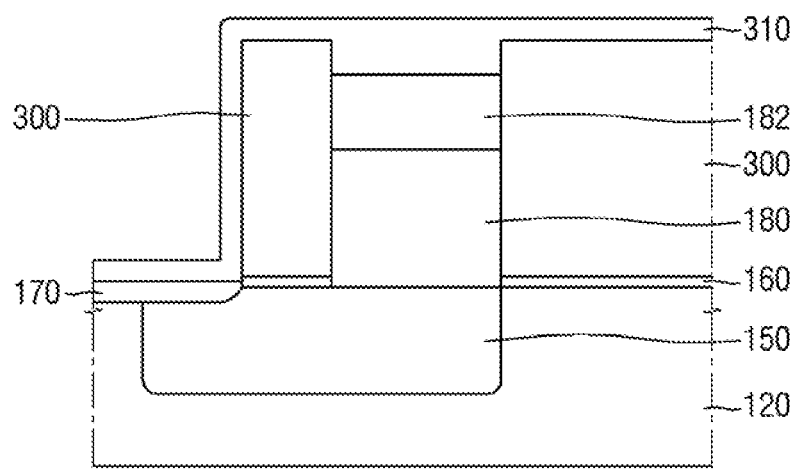
FIG. 6 is a cross-sectional view illustrating formation of a silicide layer during manufacture of a semiconductor device according to an exemplary embodiment of the present inventive concept.

FIG. 6 is a cross-sectional view illustrating formation of the suicide layer 170 of the semiconductor device 100 according to an exemplary embodiment of the present inventive concept. As shown, the suicide layer 170 may be formed such that a portion of the suicide layer 170 is in contact with the bottom source/drain region 150 to be electrically connected to each other.

First of all, Ti or TiN layer 310 with a predetermined thickness may be formed using, for example, a physical vapor deposition (PVD), on the insulating oxide 300, the insulating layer 182, and the exposed portion 410 of the substrate 120. After forming the Ti or TiN layer 310 on the exposed portion 410 of the substrate 120, the formed Ti or TiN layer 310 may be annealed at a predetermined temperature for a predetermined time period to form a metal silicide. Alternately, a laser irradiation or an ion beam mixing may be performed to form the silicide.

As shown, a portion of the Ti or TiN layer 310 may react with underlying silicon (Si) of the silicon substrate to form the titanium suicide layer 170, and unreacted Ti or TiN may remain on the formed titanium silicide layer 170. In another example, substantially the entire Ti or TiN layer 310 may be consumed in the reaction with silicon (Si) for forming the suicide, layer 170, leaving substantially no Ti or TiN on the titanium silicide layer 170.

The thickness of the suicide layer 170 may depend on, for example, the thickness of Ti or TiN layer 310 formed on the substrate 120, the annealing temperature, and/or the annealing time. In one embodiment, the thickness of the silicide layer 170 after annealing may be substantially the same as the thickness of the bottom spacer 160. In another embodiment, the height of an upper surface of the silicide layer 170 may be substantially the same as the height of an upper surface of the bottom spacer 160.

In addition to titanium silicide ($TiSi_2$), different types of silicide may be formed depending on the type of the metal layer used in the silicide formation, for example, including, but not limited to, $WSi_2$, $NiSi$, or $CoSi_2$.

After the silicide layer 170 formation, the unreacted Ti or TiN layer 310 may be removed. In one example, unreacted Ti or TiN layer 310 may be removed from upper surfaces of the insulating oxide 300, the insulating layer 182, and the silicide layer 170, leaving the silicide layer 170 formed on the substrate 120.

Figure 7:
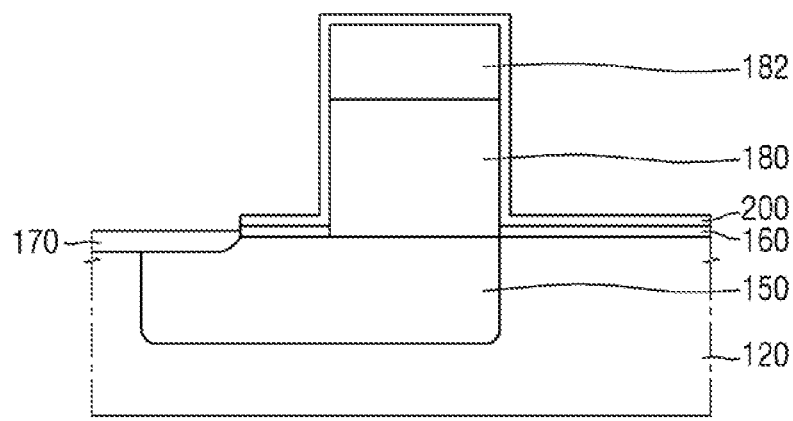
FIG. 7 is a cross-sectional view illustrating the insulating oxide removal and formation of a gate dielectric layer during manufacturing of a semiconductor device according to an exemplary embodiment of the present inventive concept.

FIG. 7 is a cross-sectional view illustrating removal of the insulating oxide 300 and formation of gate dielectric layer 200 according to an exemplary embodiment of the present inventive concept. As shown, the insulating oxide 300 may be removed to expose the bottom spacer 160, the semiconductor layer 180, and the insulating layer 182 using, for example, the reactive ion etching (RIE). The gate dielectric layer 200 may be formed on the bottom spacer 160, the insulating layer 182, and the semiconductor layer 180. In one embodiment, the gate dielectric layer 200 may be formed on the substantially entire outer surface of the semiconductor layer 180. As described above, examples of the gate dielectric layer 200 may include, but are not limited to, silicon oxide ($SiO_2$), silicon nitride (SiN), silicon oxynitride (SiON), zirconium oxide ($ZrO_2$), zirconium oxynitride (ZrON), hafnium zirconium oxide, aluminum oxide ($Al_2O_3$), tantalum pentoxide ($Ta_2O_5$), or compounds thereof. In another example, the gate dielectric layer 200 may include high K dielectric materials, for example, barium titanate, barium strontium titanium oxide, titanium oxide, or compounds thereof.

Figure 8:
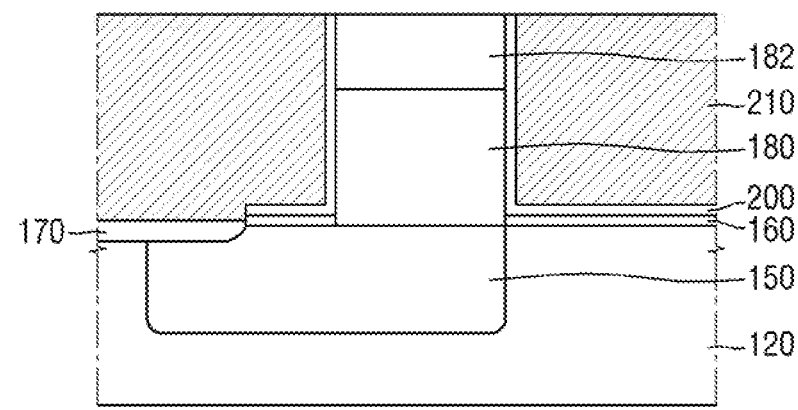
FIG. 8 is a cross-sectional view illustrating forming a gate electrode during manufacturing of a semiconductor device according to an exemplary embodiment of the present inventive concept.

FIG. 8 is a cross-sectional view illustrating formation of the gate electrode 210 according to an exemplary embodiment of the present inventive concept. In one example, the gate electrode 210 may be formed on the gate dielectric layer 200 disposed on the semiconductor layer 180, insulating layer 182, and the silicide layer 170.

The gate electrode 210 may be formed using, for example, but not limited to, the chemical vapor deposition (CVD), the plasma enhanced chemical vapor deposition (PECVD), an atomic layer deposition (ALD), a molecular beam epitaxy (MBE), a pulsed laser deposition (PLD), a sputtering, or a plating. The gate electrode 210 may include, for example, but not limited to, tungsten (W), cobalt (Co), copper (Cu), tantalum (Ta), titanium (Ti), ruthenium (Ru), aluminum (Al), metal carbides, or metal nitrides.

In one embodiment, a chemical mechanical planarization (CMP) may be performed to the gate electrode 210 for removing excess portion of the gate electrode 210. The CMP for the gate electrode 210 may continue until an upper surface of the insulating layer 182 is reached, when the height of the gate electrode 210 may be substantially the same as the height of the insulating layer 182.

The gate dielectric layer 200 may not be shown in the FIG. 9 through FIG. 18 due to the congestion of features in the vicinity of the gate electrode 210 unless necessary. However, it is noted that the gate dielectric layer 200 is positioned in contact with the gate electrode 210 in the FIG. 9 through FIG. 18.

Figure 9:
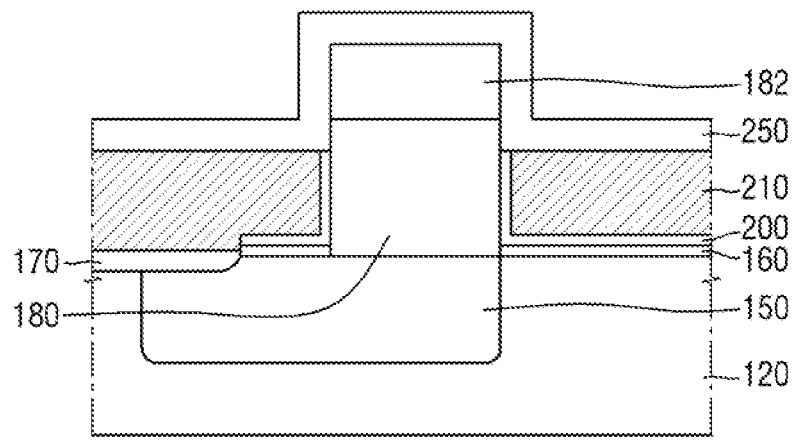
FIG. 9 is a cross-sectional view illustrating a gate electrode recess and formation of a spacer during manufacturing of a semiconductor device according to an exemplary embodiment of the present inventive concept.

FIG. 9 is a cross-sectional view illustrating the gate electrode recess and the formation of a spacer 250 according to an exemplary embodiment of the present inventive concept. As illustrated, the gate electrode 210 may be etched down to have a reduced thickness. In one embodiment, the height of an upper surface of the gate electrode 210 may be controlled to be substantially the same as the height of an upper surface of the semiconductor layer 180, while, in another embodiment, the height of the upper layer of the gate electrode 210 may be less than the height of the upper layer of the semiconductor layer 180. The spacer 250 may be formed on the surface of the gate electrode 210 and the insulating layer 182 for protecting the gate electrode 210 and the insulating layer 182. The spacer 250 may include insulating material, for example, silicon nitride (SiN), and may be formed, for example, by the low pressure chemical vapor deposition (LPCVD).

Figure 10:
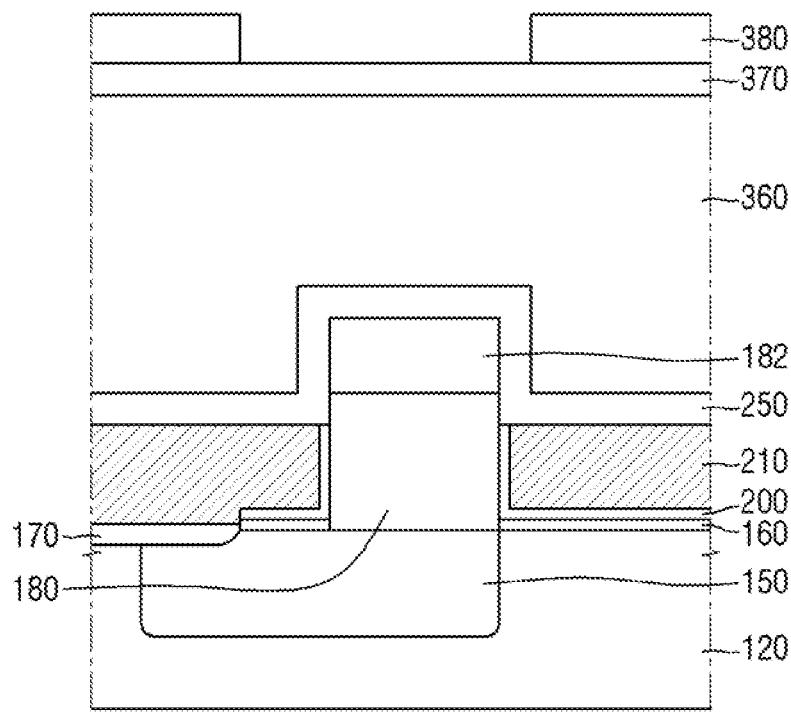
FIG. 10 is a cross-sectional view illustrating a photolithography process for an optical planarization layer (OPL) during manufacturing of a semiconductor device according to an exemplary embodiment of the present inventive concept.

FIG. 10 is a cross-sectional view illustrating the photolithography process of an organic planarization layer (OPL) 360 for forming the metal mask patterns according to an exemplary embodiment of the present inventive concept. As illustrated, the OPL 360 may provide a smooth surface of the OPL 360 on the spacer 250 whose surface is not substantially smooth for the photolithography process. An anti-reflection layer 370 may be formed on the OPL 360 for preventing an interference of an incident light for the photolithography process. A photoresist layer may be formed on the anti-reflection layer 370, and a portion of the photoresist layer may be removed to form one or more photoresist patterns 380 based on the mask design. In one embodiment, one or more of the photoresist patterns 380 may be formed to align with the silicide layer 170 when viewed from a direction perpendicular to the top surface of the substrate 120

If the photoresist is a positive type, a portion of the photoresist exposed by illumination may be cross-linked and may be removed. As a result, unexposed portion of the photoresist may remain to form a predetermined pattern. In another example, for a negative photoresist, a portion of the photoresist exposed by illumination may be cross-linked, and remain to form a predetermined pattern. Unexposed photoresist may be washed away in the subsequent stripping process.

Figure 11:
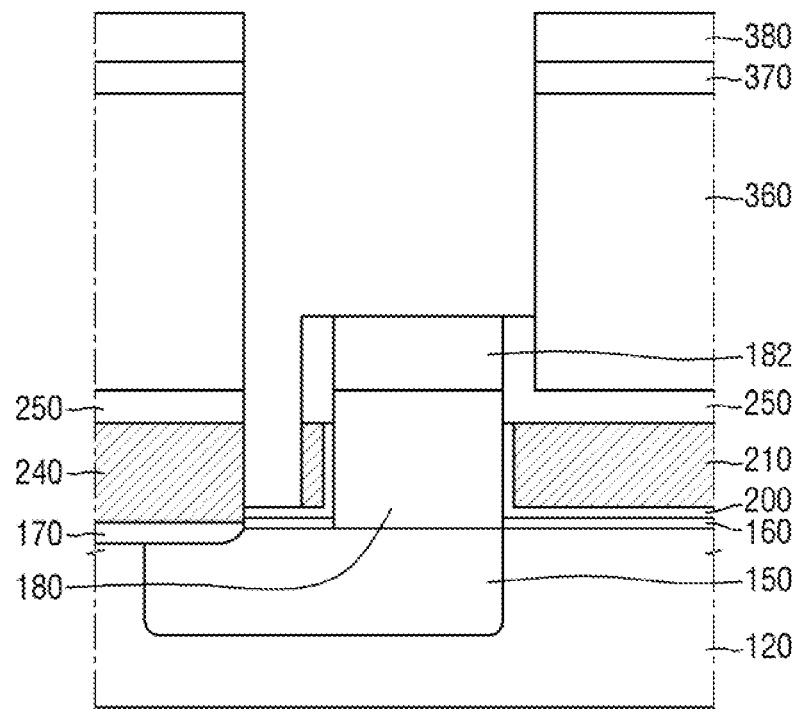
FIG. 11 is a cross-sectional view illustrating removing the OPL and gate electrode during manufacturing of a semiconductor device according to an exemplary embodiment of the present inventive concept.

FIG. 11 is a cross-sectional view illustrating removing the OPL 360 and gate electrode 210 during manufacturing of a semiconductor device according to an exemplary embodiment of the present inventive concept. In one embodiment, a portion of the anti-reflection layer 370 and the OPL 360 may be removed by the etching process using the photoresist patterns 380 as a mask. In one example, the anti-reflection layer 370 and the OPL 360 may be etched by dry etching, for example, a reactive ion etching (RIE). On the other hand, the metal pad 240 on the silicide layer 170 may not be removed during the reactive ion etching since the photoresist patterns 380 may work as the mask to block the high energy ions.

The reactive ion etching (RIE) may proceed all the way in a downward direction until the bottom spacer 160 is reached, where the bottom spacer 160 may work as an etch-stop layer by not being attacked by the high energy ions generated in the reactive ion etching. The operating conditions for the reactive ion etching may be adjusted to have a portion of the spacer 250 formed on the insulating layer 182 is removed to expose the upper surface of the insulating layer 182.

Figure 12:
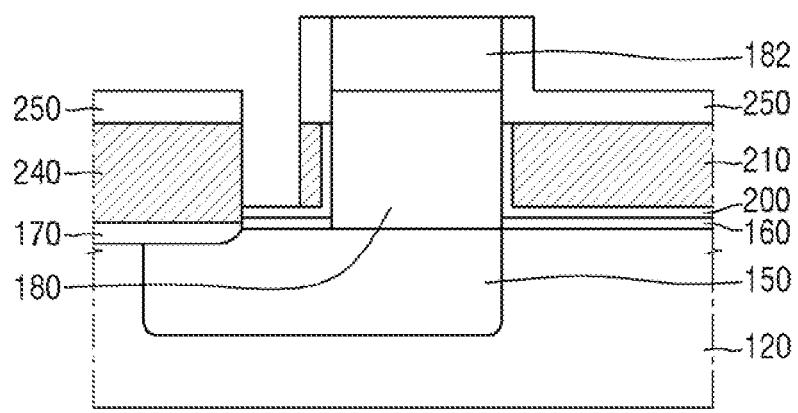
FIG. 12 is a cross-sectional view illustrating removing the OPL during manufacturing of a semiconductor device according to an exemplary embodiment of the present inventive concept.

FIG. 12 is a cross-sectional view illustrating removing the OPL 360 according to an exemplary embodiment of the present inventive concept. In one embodiment, the anti-reflection layer 370, and the photoresist patterns 380 may be removed by, for example, dry etching using, for example, carbon dioxide ($CO_2$) gas. As a result, the spacer 250, the bottom spacer 160 and the gate electrode 210 may be exposed. In addition, an upper surface of the insulating layer 182 may also be exposed.

Figure 13:
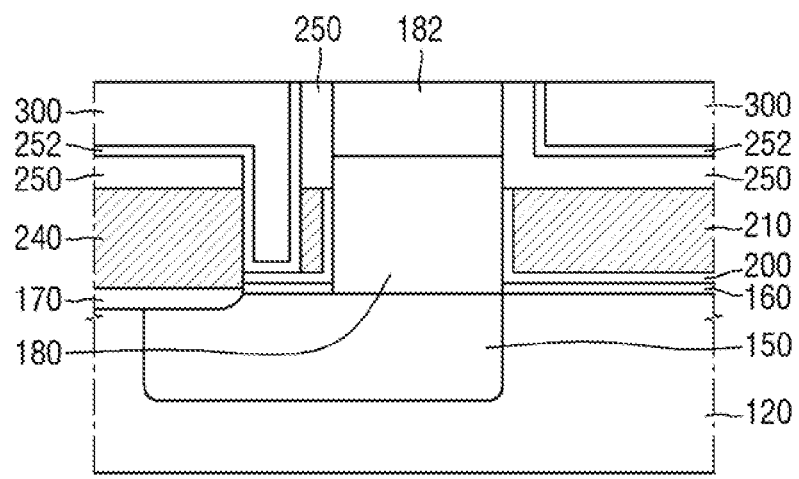
FIG. 13 is a cross-sectional view illustrating formation of a spacer and the insulating oxide during manufacturing of a semiconductor device according to an exemplary embodiment of the present inventive concept.

FIG. 13 is a cross-sectional view of forming a spacer 252 and the insulating oxide 300 of the semiconductor device according to an exemplary embodiment of the present inventive concept. After the OPL 360 and the anti-reflection layer 370 are removed, the spacer 252 may be formed on the gate electrode 210, metal pad 240, bottom spacer 160, gate dielectric layer 200, and spacer 250 for protecting underlying structural features, for example, the gate electrode 210 and the metal pad 240, from the subsequent processing steps. The spacer 252 may include insulating oxide, for example, silicon nitride, and may be formed using the low pressure chemical vapor deposition (LPCVD).

The insulating oxide 300 may be formed on the spacer 252. The insulating oxide 300 may include, for example, silicon oxide (SiO). The chemical mechanical planarization (CMP) may be performed to reduce the thickness of the insulating oxide 300 formed on the spacer 252. For example, the processing parameters of the CMP may be adjusted so that the height of an upper surface of the insulating oxide 300 may be substantially the same as the height of the insulating layer 182.

Figure 14:
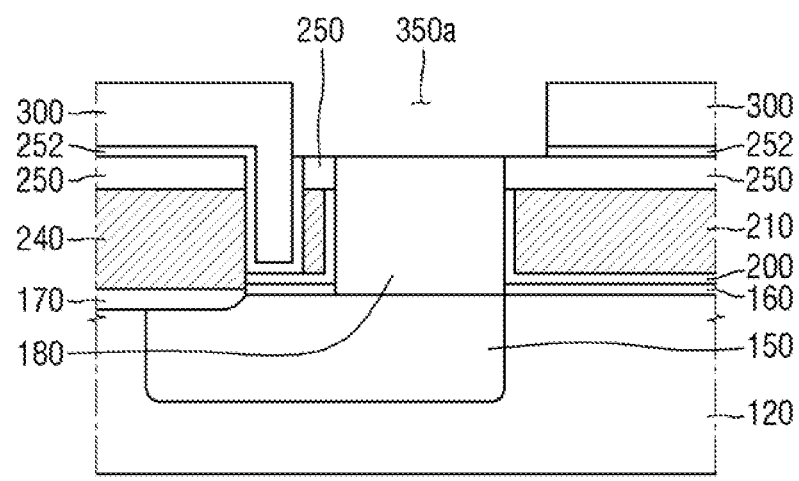
FIG. 14 is a cross-sectional view illustrating removing the insulating layer during manufacturing of a semiconductor device according to an exemplary embodiment of the present inventive concept.

FIG. 14 is a cross-sectional view illustrating the removal of the insulating layer 182 according to an exemplary embodiment of the present inventive concept. In one example, a portion of the spacer 250 and the upper surface of the insulating layer 182 may be removed to form a recess 350a using dry etching, for example, the reactive ion etching (RIE). For example, the insulating layer 182 may be etched until an upper surface of the semiconductor layer 180 is reached. As a result, the semiconductor layer 180 (the vertical channel) may be exposed. During the etching process, the height of the spacer 252 may be substantially the same as the height of the semiconductor layer 180 (the vertical channel 180). In another embodiment, the height of the spacer 252 may be less than the height of the semiconductor layer 180.

Figure 15:
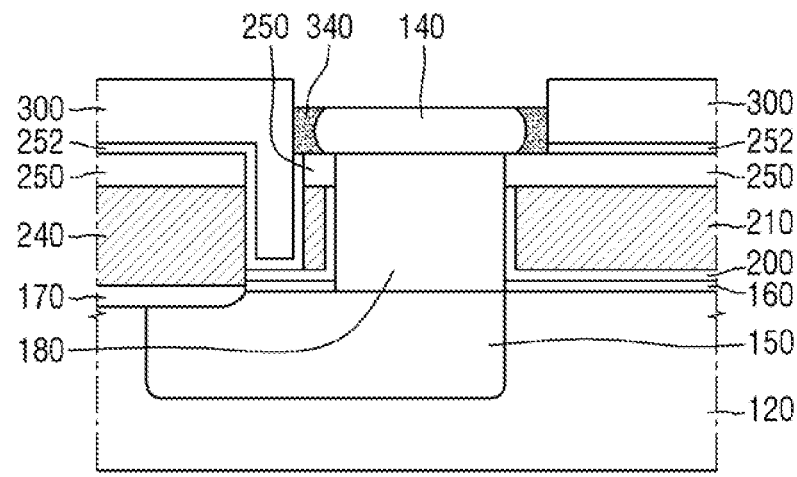
FIG. 15 is a cross-sectional view illustrating formation of a top source/drain region during manufacturing of a semiconductor device according to an exemplary embodiment of the present inventive concept.

FIG. 15 is a cross-sectional view illustrating formation of the top source/drain region 140 formed on the upper surface of the semiconductor layer 180 according to an exemplary embodiment of the present inventive concept. The top source/drain region 140 may include, for example, silicon (Si) or silicon-germanium (SiGe), and may be doped with the n-type impurities or p-type impurities, depending on the nature of the semiconductor device. The top source/drain region 140 may be formed by an epitaxial growth process.

The height of an upper surface of the top source drain region 140 may be greater than the height of an upper surface of the spacer 252. Alternatively, the height of the upper surface of the top source/drain region 140 may be substantially the same as the height of an upper surface of the spacer 252. In one example, a spacer 340 may be disposed on the top source/drain region 140 for protecting the top source/drain region 140. The spacer 340 may include, for example, silicon nitride (SiN), and may be formed using low pressure chemical vapor deposition (LPCVD).

Figure 16:
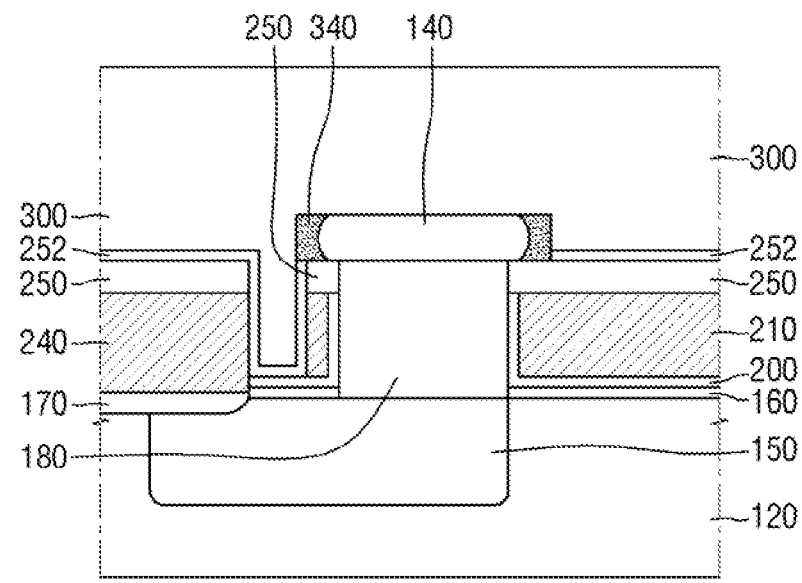
FIG. 16 is a cross-sectional view illustrating formation of the insulating oxide during manufacturing of a semiconductor device according to an exemplary embodiment of the present inventive concept.

FIG. 16 is a cross-sectional view illustrating formation of the insulating oxide 300 according to an exemplary embodiment of the present inventive concept. In one embodiment, the insulating oxide 350 300 may be formed in the recess 350a formed on the top source/drain region 140 to fill the recess 350a. The insulating oxide 350 300 may include, for example, silicon oxide, and may be the same in terms of the chemical composition as the insulating oxide 300 adjacent to the recess 350a. After the insulating oxide 300 is deposited, the CMP process may be performed to remove excess portion of the insulating oxide 300 and flatten the upper surface of the insulating oxide 300. In one example, the CMP process may be performed to make the height of the insulating oxide 300 to be substantially the same as the height of the insulating oxide 300 adjacent to the recess 350a.

Figure 17:
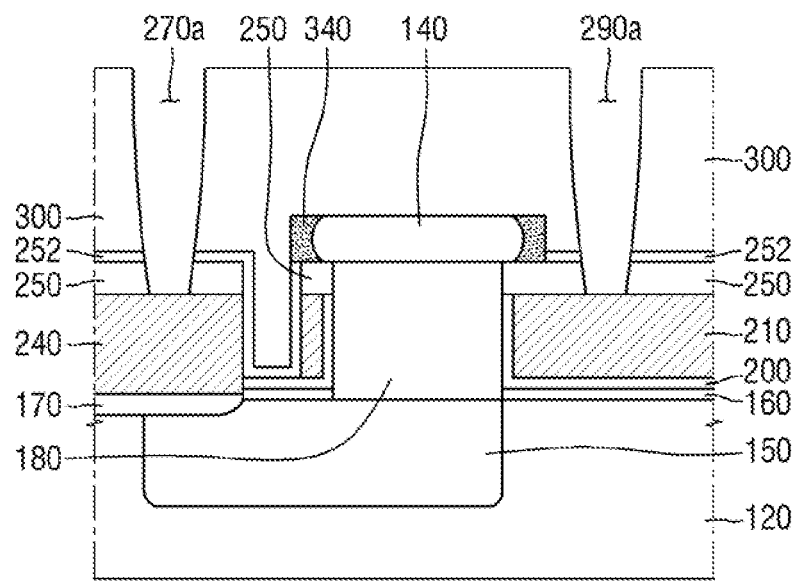
FIG. 17 is a cross-sectional view illustrating formation of first and second apertures during manufacturing of a semiconductor device according to an exemplary embodiment of the present inventive concept.

FIG. 17 is a cross-sectional view illustrating formation of first and second apertures 270a, 290a according to an exemplary embodiment of the present inventive concept. In one embodiment, the first aperture 270a may be formed through the insulating oxide 300 until the upper surface of the metal pad 240 is exposed. The second aperture 290a may be formed through the insulating oxide 300 until the upper surface of the gate electrode 210 is exposed. Portions of the insulating oxide 300 may be removed by, for example, an anisotropic etching process, for example, the reactive ion etching (RIE), or the plasma etching, using an etchant including, but not limited to $CHF_3$ or the like.

In one embodiment, the depth of the first and second apertures 270a, 290a may be substantially same with each other. Due to the dimensional similarity for the first and second apertures 270a, 290a, the first and second apertures 270a, 290a may be simultaneously formed in one etching process without using an additional mask and/or etching step. In another embodiment, the height of the metal pad 240 under the first aperture 270a may be substantially the same as the height of the gate electrode 210 under the second aperture 290a.

Figure 18:
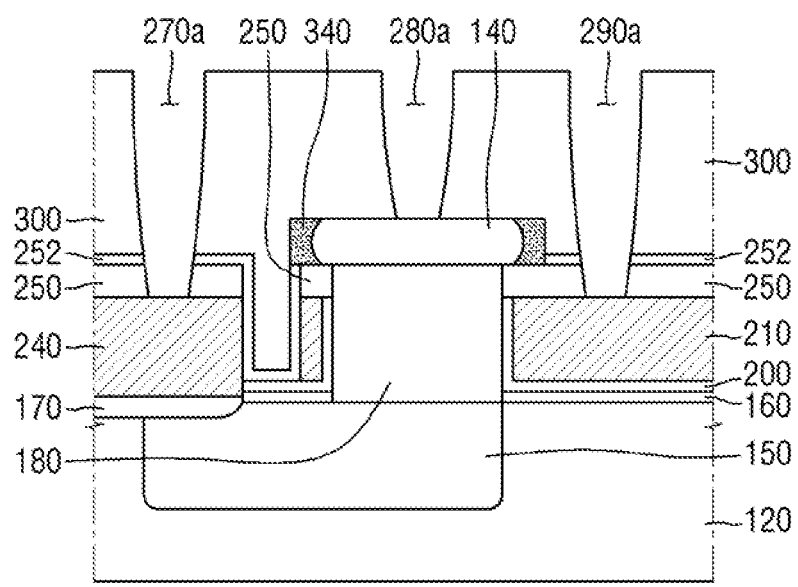
FIG. 18 is a cross-sectional view illustrating formation of a third aperture during manufacturing of a semiconductor device according to an exemplary embodiment of the present inventive concept.

FIG. 18 is a cross-sectional view illustrating formation of a third aperture 280a according to an exemplary embodiment of the present inventive concept. The third aperture 280a may be formed through the insulating oxide 300 until the upper surface of the top source/drain region 140 is exposed. The third aperture 280a may be formed using the anisotropic etching process. The depth of the third aperture 280a may be less than the depth of the first or second aperture 270a, 290a. As a result, two separate etching processes may be required in forming the first, second, and third apertures 270a, 290a, 280a. For example, due to the difference in the depth of the first, and second apertures 270a, 290a, and third aperture 280a, the first and second apertures 270a, 290a may be simultaneously formed, followed by (or preceded by) formation of the third aperture 280a in the subsequent (or previous) etching process. While not shown, the first, second, and third apertures 270a, 290a, 280a may be filled by conductive materials. For example, the apertures 270a, 290a, 280a may be filled by metallic materials, for example, including, but not limited to, tungsten (W), cobalt (Co), or copper (Cu) using the physical vapor deposition or chemical vapor deposition (CVD).

Figure 19:
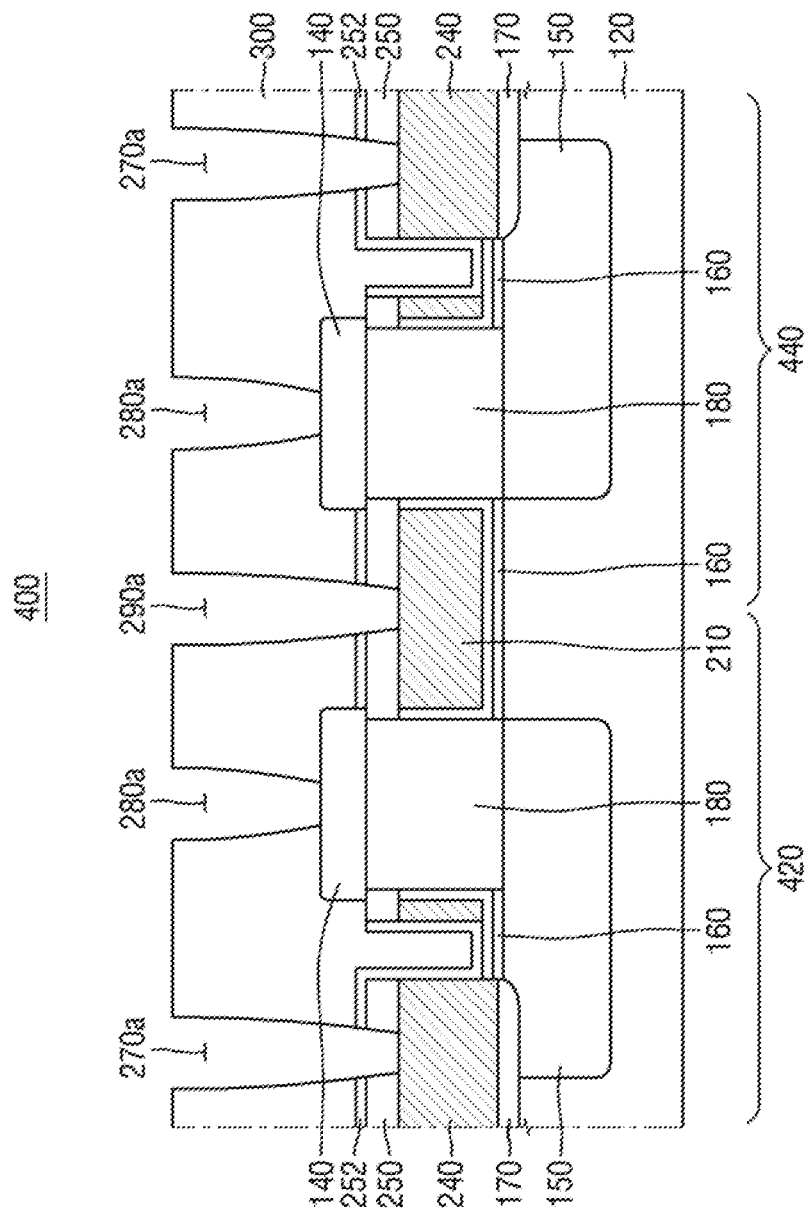
FIG. 19 is a cross-sectional view of a semiconductor device according to another exemplary embodiment of the present inventive concept.

FIG. 19 is a cross-sectional view of a semiconductor device 400 according to another exemplary embodiment of the present inventive concept. The semiconductor device 400 described herein shares many features of the semiconductor device 100, which will not be described in detail except as necessary for a complete understanding of the present inventive concept.

As shown, the semiconductor device 400 may include a plurality of FETs, for example, an n-type FET 420 and a p-type FET 440. The n-type and p-type FETs 420, 440 may share a gate electrode 210 positioned in between the n-type and p-type FETs 420, 440 to apply one of positive or negative voltage to the n-type and p-type FETs 420, 440 to control the flow or electrons or holes from the source to the drain of the n-type and p-type FET. As shown, the n-type and p-type FETs 420, 440 may be symmetrically arranged for ease of sharing the gate electrode 210, while the configuration of the n-type and p-type FETs 420, 440 may not be symmetrical in another embodiment.

The n-type and p-type FETs 420, 440 may include a first and second metal pads 240, respectively, on which the first apertures 270a may be respectively formed. In one embodiment, the height of the upper surfaces of the first and second metal pads 240 in the n-type and p-type FETs 420, 440 may be substantially the same with the height of the gate electrode 210, respectively, and a longitudinal depth of the first apertures 270a of the n-type and p-type FETs 420, 440 may be substantially the same with the longitudinal depth of the second aperture 290a.

In another embodiment, the longitudinal depth of the third apertures 280a of the n-type and p-type FETs 420, 440 may be less than the longitudinal depth of the first aperture 270a or the second aperture 290a. Accordingly, at least the first, and second apertures 270a, 290a of the n-type and p-type FETs 420, 440 may be formed using one mask without introducing additional etching process. For example, instead of having three different etching processes for each of the first, second, and third apertures 270a, 280a, and 290a, two etching processes may be performed.

The first and second metal pads 240, and the gate electrode 210 may be formed simultaneously, and may include same material selected from, for example, including, but not limited to, one of tungsten (W), cobalt (Co), copper (Cu), tantalum (Ta), titanium (Ti), ruthenium (Ru), aluminum (Al), metal carbides, or metal nitrides. The first and second metal pads 240, and the gate electrode 210 may be formed using, for example, but not limited to, chemical vapor deposition (CVD), plasma enhanced chemical vapor deposition (PECVD), atomic layer deposition (AID), molecular beam epitaxy (MBE), pulsed laser deposition (PLD), sputtering, or plating.

Figure 20:
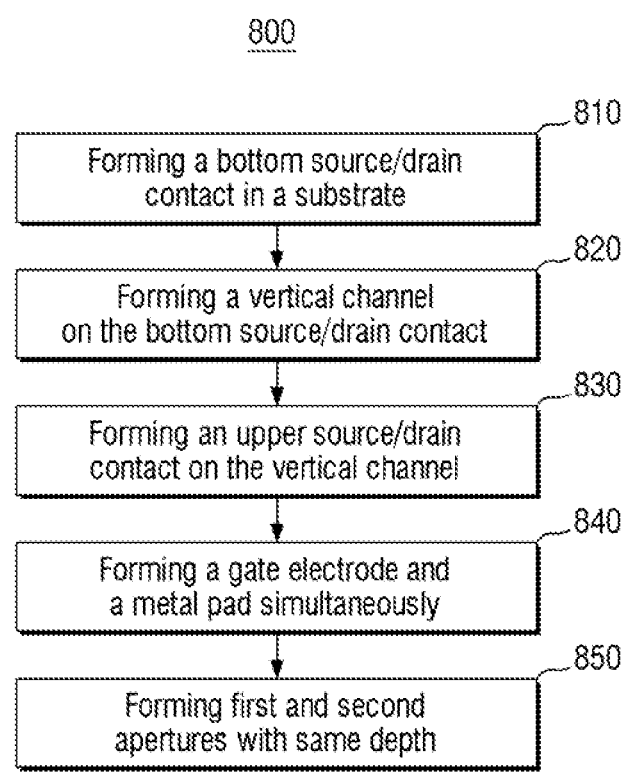
FIG. 20 is a flow chart of a method of fabricating a semiconductor device according to an exemplary embodiment of the present inventive concept.

FIG. 20 is a flow chart 800 of a method of fabricating the semiconductor device according to an exemplary embodiment of the present inventive concept. It may be noted that the sequence of steps depicted in FIG. 20 is for illustrative purposes only, and is not meant to limit the method in any way as it is understood that the steps may proceed in a different logical order, additional or intervening steps may be included, or described steps may be divided into multiple steps, without detracting from the invention.

At block 810, the bottom source/drain region 150 may be formed in the substrate 120. The bottom source/drain region 150 may include one of the n-type impurities or p-type impurities. At block 820, one end portion of the channel 180 may be formed on the bottom (e.g., first) source/drain region 150. The channel 180 may be the vertical channel, and may include, for example, an undoped semiconductor, for example, silicon (Si). At block 830, the top (e.g., upper) source/drain region 140 may be formed on the other end portion of the channel 180. The upper source/drain region 140 may include one of the n-type impurities or p-type impurities.

At block 840, the gate electrode 210 may be simultaneously formed with the metal pad 240, and the height of the gate electrode 210 may be substantially the same as the height of the metal pad 240. The gate electrode 210 and the metal pad 240 may include same material as the metal pad 240, and may include, for example, tungsten (W), cobalt (Co), copper (Cu), tantalum (Ta), titanium (Ti), ruthenium (Ru), aluminum (Al), metal carbides, or metal nitrides.

At block 850, a first and second apertures 270a, 290a may be formed on the metal pad 240 and the gate electrode 210, respectively. In one embodiment, the longitudinal length of the first and second apertures 270a, 290a may be substantially the same with each other.

As described above, exemplary embodiments of the present invention provide a method of manufacturing the semiconductor device having the first and second apertures 270a, 290a with substantially the same depth with each other. The metal pad 240 may be connected with the first aperture 270a, and may be formed simultaneously with the gate electrode 210, which may be connected with the gate electrode 210. The height of the metal pad 240 may be substantially the same as the height of the gate electrode 210, and the longitudinal depth of the first aperture 270a may be substantially the same as the longitudinal depth of the second aperture 290a. Due to the substantially same depth for the first and second apertures 270a, 290a, the etching process may be performed simultaneously.

Although illustrative embodiments of the present invention have been described in detail, it should be understood that the present invention is not intended to be limited to the specific exemplary embodiments disclosed. Based on the foregoing disclosure, those skilled in the art will be able to make various changes, substitutions and alterations without departing from the spirit and scope of the present invention as defined by the following appended claims.

What is claimed is:

1. A method for manufacturing a semiconductor device, the method comprising:
    forming a first source/drain region on a substrate;
    forming a channel on the first source/drain region;
    forming a second source/drain region on the channel;
    forming a gate electrode on an outer surface of the channel; and
    forming a metal pad on a silicide layer;
    wherein a height of an upper surface of the metal pad is the same as a height of an upper surface of the gate electrode.

2. The method of claim 1, wherein forming the gate electrode and forming the metal pad occur simultaneously.

3. The method of claim. 1, wherein the gate electrode and the metal pad include the same material selected from tungsten (W), cobalt (Co), copper (Cu), tantalum (Ta), titanium (Ti), ruthenium (Ru), aluminum (Al), metal carbides, or metal nitrides.

4. The method of claim 1, further comprising forming a gate dielectric layer between the channel and the gate electrode.

5. The method of claim 1, further comprising:
forming a first aperture coupled to the metal pad; and
forming a second aperture coupled to the gate electrode, wherein a longitudinal length of the first aperture is substantially the same as a longitudinal height of the second aperture.

6. The method of claim 5, wherein the first and second apertures are formed simultaneously.

7. The method of claim 1, further comprising:
forming a first spacer on the metal pad; and
forming a first aperture through the first spacer to expose the metal pad.

8. A method for manufacturing a semiconductor device, the method comprising:
forming a first source/drain region on a substrate;
forming a channel on the first source/drain region;
forming a second source/drain region on the channel;
forming a gate electrode on an outer surface of the channel; and
forming a metal pad on the substrate;
wherein a height of an upper surface of the metal pad is the same as a height of an upper surface of the gate electrode, wherein forming the metal pad on the substrate comprises forming the metal pad on a silicide layer formed on the substrate.

9. The method of claim 8, wherein a height of an upper surface of the silicide layer is the same as a height of an upper surface of a bottom spacer.

10. A method for manufacturing a semiconductor device, the method comprising:
forming a first spacer layer, a silicide layer, and a stack comprising a first insulating layer and a vertical channel on a substrate;
forming a gate metal layer on the first spacer layer, the silicide layer, and the stack;
forming a second spacer layer over the gate metal layer and the stack;
forming an organic planarization layer (OPL) over the second spacer layer;
removing a portion of the OPL, the second spacer layer, and the gate metal layer to expose a portion of the first spacer layer;
removing remaining portion of the OPL;
forming a third spacer layer over the second spacer layer, the gate metal layer, and the stack;

forming a second insulating layer over the second spacer layer;
removing the first insulating layer of the stack;
forming an upper source/drain region on the vertical channel;
forming a fourth spacer layer on a second source/drain region;
forming a third insulating layer on the second source/drain region;
forming a first and second apertures on the silicide layer and the first spacer layer simultaneously; and
forming a third aperture on the second source/drain region;
wherein a height of the gate metal layer on the silicide layer is the same as a height of the gate metal layer on the first spacer layer.

11. The method of claim 10, wherein the silicide layer is overlapped with the first aperture when viewed from a direction perpendicular to a surface of the substrate.

12. The method of claim 10, wherein the gate metal layer includes tungsten (W), cobalt (Co), copper (Cu), tantalum (Ta), titanium (Ti), ruthenium (Ru), aluminum (Al), metal carbides, or metal nitrides.

13. The method of claim 10, wherein the first spacer layer includes titanium nitride (TiN).

14. The method of claim 10, further comprising forming a gate dielectric layer between the vertical channel and the gate metal layer.

15. The method of claim 10, further comprising forming a lower source/drain region on the substrate.

16. A method of constructing an integrated circuit, the method comprising:
forming a silicide layer, a first spacer layer, and a stack including a plurality of layers on a substrate, respectively, with the stack surrounded by the first spacer layer, and with the silicide layer and the first spacer layer positioned right next to each other;
forming a metal layer on the first spacer layer and the silicide layer;
forming a photoresist layer on the metal layer;
patterning the photoresist layer;
removing a first portion of the metal layer formed on a first portion of the first spacer layer that is positioned between the silicide layer and the stack;
forming a second portion of the metal layer on the silicide layer and a third portion of the metal layer on a second portion of the first spacer layer, with a thickness of the second portion of the metal layer being the same as the thickness of the third portion; and
manufacturing the integrated circuit including the second and third portions of the metal layers.

* * * * *